J. GRASS.

LITHOGRAPHIC PLATE FOR OFFSET AND DIRECT PRINTING.

APPLICATION FILED JAN. 22, 1916.

Reissued Feb. 10, 1920.

14,802.

Inventor

Jacob Grass

By H. N. Low

Attorney

UNITED STATES PATENT OFFICE.

JACOB GRASS, OF FULHAM, LONDON, ENGLAND.

LITHOGRAPHIC PLATE FOR OFFSET AND DIRECT PRINTING.

14,802. Specification of Reissued Letters Patent. Reissued Feb. 10, 1920.

Original No. 1,155,352, dated October 5, 1915, Serial No. 852,867, filed July 24, 1914. Application for reissue filed January 22, 1916. Serial No. 73,740.

*To all whom it may concern:*

Be it known that I, JACOB GRASS, subject of the German Emperor, residing at 104 New King's road, Fulham, London, England, have invented certain new and useful Improvements in and Relating to Lithographic Plates for Offset and Direct Printing, of which the following is a specification.

This invention relates to the production of metal lithographic plates, and its object is to enable the plate to carry more ink than hitherto, thereby imparting a deeper color to the print obtained from the plate, either directly or through the medium of an offset surface.

In the usual method of providing a metal lithographic plate with a printing surface, the greasy printing surface is applied to the surface of the plate by means of a transfer, obtained in the well-known manner, whereafter the surface of the plate surrounding the various portions of the printing surface, is cleaned from scum by means of a liquid. This latter treatment is called etching, although not etching in the literal sense. The printing surface of an ordinary metal lithographic plate consists of a greasy substance on the surface of the plate.

Now according to the present invention, the printing surface of a metal lithographic plate is etched intaglio into the plate, whereby the printing surface, consisting of intaglio recesses, can take up and impart more ink, than the mere "surface" printing surfaces hitherto provided on lithographic plates.

The intaglio printing surface is formed on the metal lithographic plate, by printing photographically through a positive transparency on a sensitized colloid film coating the plate, and afterward etching the plate through the exposed and treated film.

Figure 1 of the drawings is an illustration on an enlarged scale of a lithographic plate made in accordance with the invention.

Figure 1:
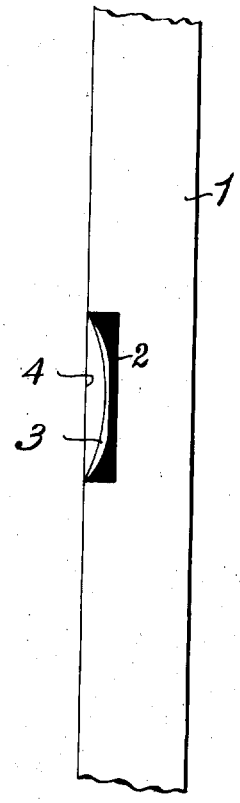

In said figures the numeral 1 designates a thin flat plate of metal which forms the ordinary lithographic plate, such as zinc or aluminum, having a groove or depression 2 therein, constituting an intaglio portion of the plate which is coated with varnish as shown at 3 within said groove, said coating of varnish covering the bottom of the depression, while the ink designated by the numeral 4 is filled into the groove over the varnish which serves as a mat to hold a maximum quantity of the ink and which extends to the surface of the plate.

The process is as follows: A zinc or aluminum lithographic plate is coated with a sensitive colloid film, such as fish glue sensitized with a bichromate. A positive transparency, rendered suitably opaque, is placed on the sensitized film. For producing a direct printing plate the transparency is placed face downward on the plate; for producing an offset printing plate, the transparency is placed face uppermost and away from the plate, the transparency being suitably thin. On exposure to light, the portions of the sensitized coating of the plate which are beneath the transparent portions of the transparency harden. After removal of the transparency, the plate is washed with water which dissolves away the unhardened portions of the coating of the plate, and the plate is dipped in a dye bath, for instance a bath of methyl violet dye, to render the picture or the like now on the plate visible. After being dried, the plate is immersed from 2 to 3 minutes in an etching bath, for instance a perchlorid of iron bath. The usual etchers' precautions in having the etching liquid of the correct consistency should be observed. After etching, the hardened glue or the like film is softened by diluted hydrochloric acid or other means, and the plate is dried. The intaglio portions of the plate can then be filled in with lithographic ink, but to cause the ink to hold better in the recesses and impart a deeper color to the print obtained from the plate a varnish which is not dissolved by water or grease, such as celluloid varnish, is first rubbed into the recesses or intaglio portions of the plate. Celluloid varnish being a mat varnish also provides a holdfast for the ink which enters into the pores thereof. The celluloid varnish is rubbed or worked in by means of a cloth and the ink is then rolled into the varnished intaglio recesses. The glue or like film is then washed away by sponging the plate with water. The plate is now gummed over with gum-arabic or the like to prevent oxidation, and is then ready for the machine.

The positive transparency may be produced by photography, by direct impression from a printing surface, such as a half-tone block or set-up type, by type-writing or other suitable manner and rendered sufficiently opaque by dusting over with a suitable powder, The positive transparency can for example be produced by making an impression from a printing surface upon gelatin tracing paper, or this medium has the type-written matter directly typed thereon. The transparency is then dusted over with an opaque powder, such as powdered graphite, bronze, silver or the like powder, which, owing to the powder adhering to the varnish of the impression or typed matter, renders the same opaque.

It will be understood that the lithographic plate, or its equivalent, above referred to has a normal surface (on or into which the etching is done) which is receptive of water and, when dampened, non-receptive of lithographic ink. This quality may be sufficiently indicated by the words "lithographic plate" because all lithographic surfaces have this quality, which is imparted by graining the metal surfaces in a known manner. The said etching for two or three minutes is for so short a time that it produces a very shallow intaglio which is or may be almost imperceptible to sight and touch, and this etching may be otherwise described as a removal of the grain of the surface, which destroys its water-absorbing quality, but said quality remains on all of the unetched surface of the plate. But the invention is not limited to any particular length of time of etching or depth of etching so long as the essential result is accomplished.

Figure 2:
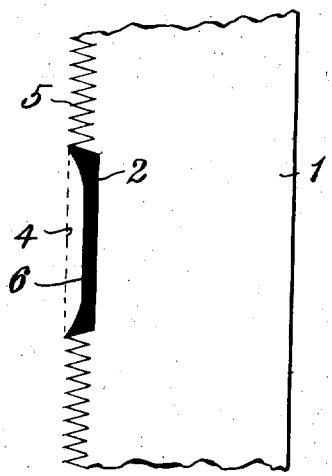
Fig. 2 is a greatly magnified section of the plate.

Fig. 2 of the drawings shows a greatly magnified section of the plate 1, the water-receptive grain or roughening of which is indicated conventionally at 5. This grain is removed down to the solid ungrained body of the plate or slightly below the bottom of said grain to form the intaglio 2. 6 is the primary charge of lithographic ink applied in the intaglio before the hardened part of the film is removed. A dotted line at 4 indicates the impression ink applied when the plate is used for printing.

The deep color of the impression produced by this plate is primarily due to the intaglio ink-carrying recesses, as distinguished from normal, high and grained ink-carrying surfaces heretofore used, as in the case of planographic plates.

Figure 3:
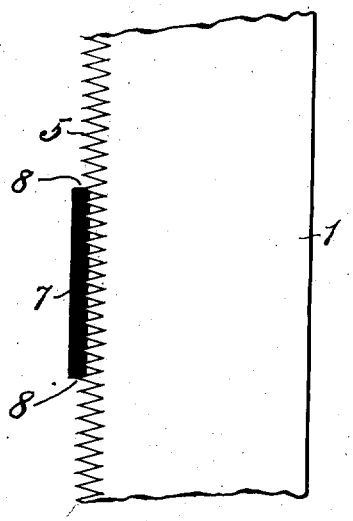
Fig. 3 is a similar magnified section illustrating a planographic plate.

In order to give a better understanding of the invention by comparison, a portion of a planographic plate is illustrated in Fig. 3. On this plate the portions of the same which are to be receptive of lithographic printing ink are made so receptive by a greasy ink applied as indicated at 7 on the top of the grain 5. In the use of this plate the desired quantity of ink is not usually or always taken up and impressed by the said parts 7, it is difficult to dampen the grain 5 in what may be called the corners 8, which mark the boundary between the inked parts 7 and the water-receiving parts 5, and consequently there is a tendency for the ink to gradually spread into said corners and encroach upon the parts of the plate which are intended to receive only water and not ink, and repeated impressions tend to wear away the design indicated at 7 by reason of the repeated operations of the damping and inking rolls. These difficulties are increased when the press is run at any but low speeds. In the case of my plate the slight walls surrounding all lines or dots constituting the design constantly define said lines and dots both in the reception of ink and in the impressing of same, and protect the design from friction and wear, which would otherwise impair it. A common difficulty is that the surface of the plate cylinder and of the offsetting cylinder do not always operate with a perfect rolling action, but on the contrary with some slight rubbing, because they are not always perfectly concentric or perfectly cylindrical, and their speeds are not absolutely the same as the speeds of the surfaces which contact with them. In the case of my plate there is no friction on the design itself. Consequently the plate herein described will endure to produce clear and uniform impressions throughout any run of impressions which will be required in practice.

I claim:

1. A method of producing a printing surface on a metal lithographic plate, consisting of coating said plate with a sensitized film, exposing said film to light through a positive transparency, washing said plate after removal of said transparency, drying said plate, etching said plate, softening said film after said etching and removing the same, drying said plate, applying varnish insoluble in water or grease to the etched recesses of said plate, and filling said recesses with lithographic ink to a plane coincident with the face of the plate, said varnish serving as a mat to hold a maximum quantity of ink, thereby imparting a deeper color to the print obtained from the plate.

2. A method of producing a printing surface on a metal lithographic plate, consisting in coating said plate with a sensitized colloid film, exposing said film to light through a positive transparency, washing said plate after removal of said transparency, drying said plate, etching said plate, softening said film, after said etching, drying said plate, applying celluloid varnish to the etched recesses of said plate and filling said varnished recesses with lithographic ink and removing the film.

3. A method of producing a printing surface on a metal lithographic plate, consisting in coating said plate with a sensitized film, exposing said film to light through a transparency, washing said plate after removal of the transparency, drying said plate, etching said plate, softening said film after said etching, drying said plate, applying celluloid varnish to the etched recesses of said plate, filling said varnished recesses with said lithographic ink, removing said film by washing around the recesses and gumming said plate to prevent oxidation.

4. The process of producing an intaglio printing surface on a metal lithographic plate, consisting in coating the same with a sensitive colloid film in the form of a glue, placing a positive transparency on the sensitized film rendered suitably opaque, hardening the portions of the sensitized coating of the plate which are located beneath the transparent portions of the transparency, dissolving away the unhardened portions of the coating of the plate by washing with water, dipping the plate in a dye bath to render the picture or the like thereon visible, drying the plate, immersing the same in an etching bath, softening the hardened glue like film and removing the same, then drying the plate and filling the intaglio portions of the plate with lithographic ink.

5. The process of producing an intaglio printing surface on a metal lithographic plate, consisting in coating the same with a sensitive colloid film in the form of a glue, placing a positive transparency on the sensitized film rendered suitably opaque, hardening the portions of the sensitized coating of the plate which are located beneath the transparent portions of the transparency, dissolving away the unhardened portions of the coating of the plate by washing with water, dipping the plate in a dye bath to render the picture or the like thereon visible, drying the plate, immersing the same in an etching bath, softening the hardened glue like film, removing said film, then drying the plate and working celluloid varnish into the intaglio portions of the plate and then filling said intaglio portions with lithographic ink over the said varnish, whereby the latter being a mat varnish, will cause the ink to enter the pores thereof to produce a deeper color than is otherwise obtainable.

6. A method of producing a printing surface on a metal lithographic plate, consisting in coating said plate with a sensitized film, exposing said film to light through a positive transparency, washing said plate after removal of said transparency, drying said plate, etching said plate, softening said film after said etching, drying said plate filling the etched recesses of the plate with an ink-receptive material, and removing the film.

7. A method of producing a printing surface on a metal lithographic plate, consisting in coating said plate with a sensitized film, exposing said film to light through a positive transparency, washing said plate after removal of said transparency, drying said plate, etching said plate, softening said film after said etching, drying said plate, filling the recesses of the plate with lithographic ink and removing the film.

8. A metal lithographic printing surface having a normal surface which is receptive of water and non-receptive of ink when dampened, portions of said normal surface being removed to form a design or other matter to be lithographically printed.

9. A metal lithographic printing surface having a normal surface which is receptive of water and non-receptive of ink when dampened, and having ink-receiving surfaces below said normal surface which lower surfaces form a design or other matter to be lithographically printed.

In testimony whereof I have affixed my signature hereto.

JACOB GRASS.

Witnesses:
H. N. Low,
William Grass.